United States Patent
Baillin et al.

(10) Patent No.: US 9,929,082 B2
(45) Date of Patent: Mar. 27, 2018

(54) RECEIVING STRUCTURE FOR ELECTRICALLY CONNECTING A NANO-OBJECT ON A SURFACE THEREOF AND RE-ESTABLISH ELECTRICAL CONTACT WITH THE NANO-OBJECT ON THE OPPOSITE SURFACE, AND METHODS FOR MANUFACTURING THE STRUCTURE

(71) Applicant: Commissariat à l'énergie atomique et aux énergies alternatives, Paris (FR)

(72) Inventors: Xavier Baillin, Crolles (FR); Patrick Leduc, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 191 days.

(21) Appl. No.: 14/408,478

(22) PCT Filed: Jun. 25, 2013

(86) PCT No.: PCT/EP2013/063204
§ 371 (c)(1),
(2) Date: Dec. 16, 2014

(87) PCT Pub. No.: WO2014/001290
PCT Pub. Date: Jan. 3, 2014

(65) Prior Publication Data
US 2015/0243594 A1    Aug. 27, 2015

(30) Foreign Application Priority Data

Jun. 27, 2012 (FR) .................................. 12 56111

(51) Int. Cl.
*H01L 23/498* (2006.01)
*H01L 21/768* (2006.01)
(Continued)

(52) U.S. Cl.
CPC ...... *H01L 23/49827* (2013.01); *H01L 21/225* (2013.01); *H01L 21/265* (2013.01);
(Continued)

(58) Field of Classification Search
CPC ............. H01L 23/49827; H01L 23/481; H01L 21/265
See application file for complete search history.

(56) References Cited

U.S. PATENT DOCUMENTS 8,692,385 B2    4/2014   Thuaire
2004/0219731 A1 11/2004  Hartwich
(Continued)

FOREIGN PATENT DOCUMENTS

FR      10 61128 A1    6/2012
WO      2009/022982 A1 2/2009

OTHER PUBLICATIONS

Ma Han Thu Lwin et al "Silicon on isulator nanoscale backside interconnects for atomic and molecular scale circuits" Journal of Vacuum Science and Technology: Part B, vol. 28, No. 5, Sep. 2, 2010.

(Continued)

*Primary Examiner* — Eliseo Ramos Feliciano
*Assistant Examiner* — Mikka Liu
(74) *Attorney, Agent, or Firm* — Pearne & Gordon LLP

(57) ABSTRACT

Receiving structure for electrically connecting a nano-object on a surface thereof and re-establish electrical contact with the nano-object on the opposite surface, and methods for manufacturing the structure.
The invention, that can be used for molecular characterisation, makes use of a support (44) to connect a nano-object (50) onto its top face and continue the electrical contact on its bottom face. At least two interconnects (52, 54) pass through the support. The two faces of the support comprise contact continuity zones (56, 58, 60, 62) for the intercon- (Continued)

nects. According to the invention, at least the zones (56, 58) in the top face are doped zones each having a pattern adapted to the fan out of the interconnect associated with it, on this face.

10 Claims, 7 Drawing Sheets

(51) Int. Cl.
*H01L 21/225* (2006.01)
*H01L 21/265* (2006.01)
*H01L 21/324* (2006.01)
*H01L 29/06* (2006.01)
*H01L 23/48* (2006.01)

(52) U.S. Cl.
CPC ...... *H01L 21/324* (2013.01); *H01L 21/76898* (2013.01); *H01L 23/481* (2013.01); *H01L 23/49838* (2013.01); *H01L 29/0649* (2013.01); *H01L 2924/0002* (2013.01)

(56) References Cited

U.S. PATENT DOCUMENTS

| | | |
|---|---|---|
| 2006/0046345 A1 | 3/2006 | Akram |
| 2010/0252824 A1 | 10/2010 | Tour |
| 2011/0018138 A1* | 1/2011 | Thet .................. B82Y 10/00 257/774 |

OTHER PUBLICATIONS

French Search Report issued in Application No. FR 12 56111 dated May 15, 2013.
International Search Report issued in Application No. PCT/EP2013/063204 dated Sep. 10, 2013.
Written Opinion issued in Application No. PCT/EP2013/063204 dated Sep. 10, 2013.

* cited by examiner

RECEIVING STRUCTURE FOR ELECTRICALLY CONNECTING A NANO-OBJECT ON A SURFACE THEREOF AND RE-ESTABLISH ELECTRICAL CONTACT WITH THE NANO-OBJECT ON THE OPPOSITE SURFACE, AND METHODS FOR MANUFACTURING THE STRUCTURE

TECHNICAL FIELD

This invention relates to a receiving structure for electrically connecting a nano object on one face thereof and for continuing electrical contact on the opposite face, and to methods for manufacturing this structure.

"Nano objects" refers to objects for which at least one of the dimensions is within the range between about 1 nm and 100 nm. This category of nano objects includes nanoparticles (organic and inorganic), nanotubes, nanowires, molecules and combinations of molecules, particularly biological molecules, for example such as viruses and "small" bacteria.

The invention relates to applications particularly in electronics, optics, chemistry and biology. In particular, it can be used to make molecular characterisation boxes.

STATE OF PRIOR ART

In order to determine at least the electrical functionality of a nano object, it is necessary to place, graft or hybrid it on a support provided with electrical connectors. The roughness of these connectors must be of the order of the atomic scale, in other words of the order of 0.1 nm. Considering the dimensions of these electrical connectors, the distance between them must be as similar as possible to the size of the nano object.

Furthermore, in readiness for collective integration, it is preferable to use a silicon substrate considering the collective technologies that have been developed for the microelectronic industry.

At the present time, there is no simple technological solution to collectively hybridise nano-objects on a silicon wafer with a surface for which the roughness is perfectly controlled. The following document discloses a hybridising technique and should be referred to:

[1] WO 2009/022982, Nano-interconnects for atomic and molecular scale circuits.

This technique is shown in FIG. 1 in the appended drawings, that shows a diagrammatic sectional view of a support fitted with nanometric-sized interconnects. This technique uses an SOI ("Silicon On Insulator") type substrate 2 comprising a thick layer of silicon 4, a buried oxide (BOX) layer 6, and a thin silicon layer 8.

Nanovias 10 and 12 are machined from the lower face of the substrate. They open up onto an internal face located at the bottom of a cavity 14, in which the nano-object 16 to be connected will be placed.

Through electrical connectors composed of the nanovias, also referred to as TSV (Through Silicon Vias), are made by means of a special tool, namely a FIB (Focused Ion Beam) for local machining of the nanovias. The diameter and also the depth of these nanovias will be limited by the technique used.

The technique disclosed by document [1] cannot use the collective photolithography and etching method. Furthermore, through nanovias are inclined in order to reduce the spacing between them. Machining is thus further complicated because the angle of inclination of the ion beam relative to the plane of the substrate has to be controlled precisely.

The following document discloses another technique:

[2] French patent application No. 1061128, filed on Dec. 23 2010, Device for connecting nano-objects to external electrical systems and method of making the device.

This other technique is shown in FIG. 2 in the appended drawings, that shows a diagrammatic sectional view of an example of the device disclosed in document [2].

The device in FIG. 2 comprises:

an upper layer 18 provided with upper contact pads 20 to be connected to a nano-object 22, a lower layer 24 provided with lower contact pads 26 to be connected to an external electrical system 28, a connecting layer 30 comprising through electrical vias 32 in contact with the lower pads, and between the connecting layer and the upper layer, at least two layers 34, 36 provided with conducting tracks 38 and electrical vias 40 to connect the upper pads to the lower pads.

This other technique is also difficult to implement.

PRESENTATION OF THE INVENTION

The purpose of this invention is to correct the above-mentioned disadvantages. It discloses a structure that is easier to manufacture than the structures disclosed in documents [1] and [2], so that one or several nano-objects can be electrically connected to it.

In particular, a receiving structure also called an interposer is disclosed, made of silicon and that will hold one or several nano-objects, and will connect them from its front face reconstructed at the atomic scale to its back face, using only microelectronics technologies to fan out electrical contacts between these two faces.

This receiving structure uses two electrical levels on an SOI type structure, one composed of tracks made conducting by doping, the other by means of through vias connected to the tracks. Specifically, the purpose of this invention is a receiving structure comprising:

a support with a first face or top face and a second face or bottom face opposite the first face, for electrically connecting at least one nano-object onto the first face and to re-establish electrical contact on the second face, and at least two interconnects, namely first and second interconnects, passing through the support from the first face to the second face, in which the first face comprises first contact continuity zones and the second face comprises second contact continuity zones for the first and second interconnects, characterised in that at least the first contact continuity zones are doped zones of the support, each doped zone having a pattern adapted to the fan out of the interconnect associated with it, on the first face of the support.

According to an advantageous embodiment of the invention, the interconnects are perpendicular to the first and second faces.

According to a preferred embodiment of the receiving structure according to this invention, the support is a multi-layer and comprises at least one resistive layer at the first face of the support, and in which the doped zones are formed in the resistive layer on at least part of its thickness.

Preferably, the support is a semiconductor on insulator type support and thus comprises a semiconducting surface layer, and the resistive layer consists of the semiconducting surface layer.

According to one particular embodiment of the invention, the support comprises:
- a resistive silicon layer formed on a silica layer itself formed on a silicon substrate,
- or a resistive silicon layer formed on a monocrystalline insulator layer itself forming a substrate, for example a monocrystalline sapphire layer.

Preferably, the receiving structure according to the invention also comprises a cover with a cavity adapted to enclose the nano-object.

This invention also relates to a method for manufacturing the receiving structure according to the invention, in which:
- vias are formed from the first face of the support and an electrically conducting material is deposited in the vias in order to form the interconnects,
- doped zones of the support are formed by implantation of doping agents, and
- a heat treatment of the doped zones is performed to diffuse the implanted doping agents.

This invention also relates to another method for manufacturing the receiving structure according to the invention, in which:
- doped zones of the support are formed by implantation of doping agents,
- vias are formed from the first face of the support and an electrically conducting material is deposited in the vias in order to form the interconnects, and
- a heat treatment of the doped zones is performed to diffuse the implanted doping agents.

According to one particular embodiment of these methods, the support is thinned so that the vias can open up on the second face of the support.

Preferably, electrically conducting layers are also formed on the second face of the support, which are respectively associated with the vias, each of the electrically conducting layers being in contact with the electrically conducting material of the via that is associated with it.

According to one preferred embodiment of the method according to the invention, each via has a tubular geometry with a single tube or several coaxial tubes.

Preferably, a cover comprising a cavity is transferred onto the first face of the support. This transfer is preferably made under a controlled atmosphere.

BRIEF DESCRIPTION OF THE DRAWINGS

This invention will be better understood after reading the description of the example embodiments given below for information only and that are in no way limitative, with reference to the appended drawings in which.

DETAILED PRESENTATION OF PARTICULAR EMBODIMENTS

Figure 1:
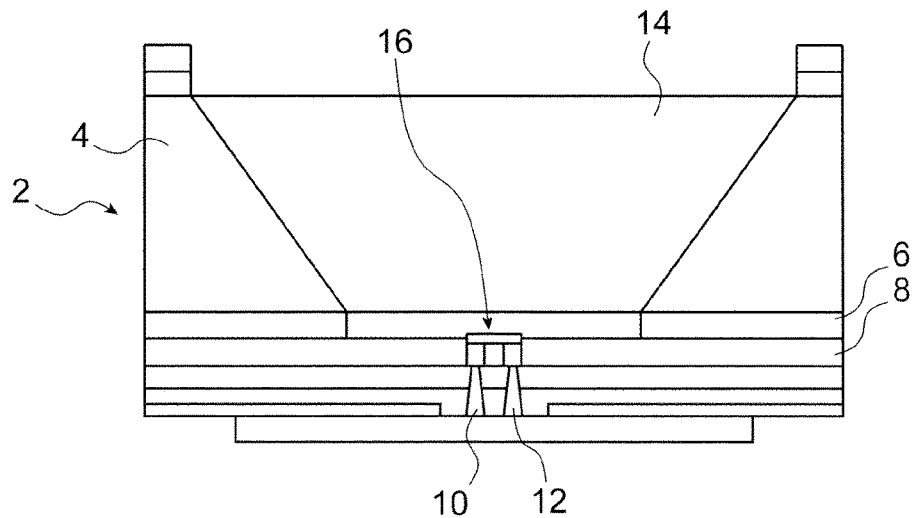
FIG. 1 is a diagrammatic sectional view of a support with interconnects disclosed in document [1], and has already been described.
Figure 2:
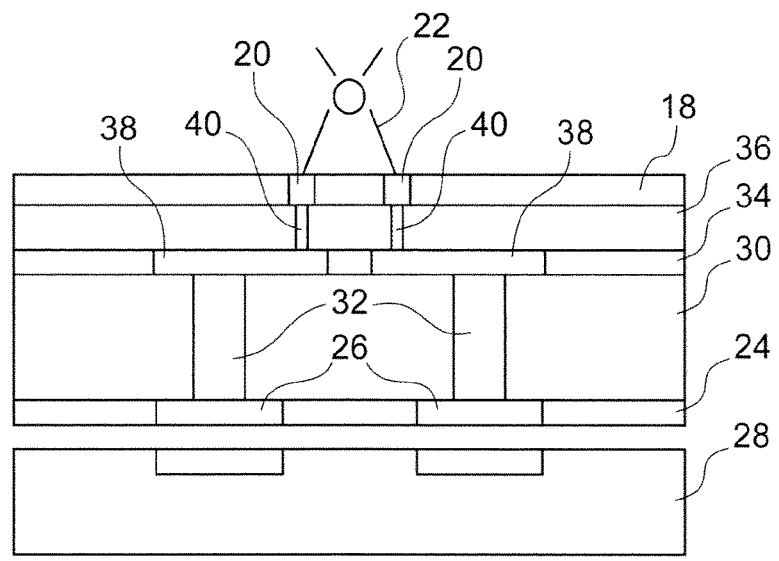
FIG. 2 is a diagrammatic sectional view of an example of the device disclosed in document [2], and has already been described.
Figure 3:
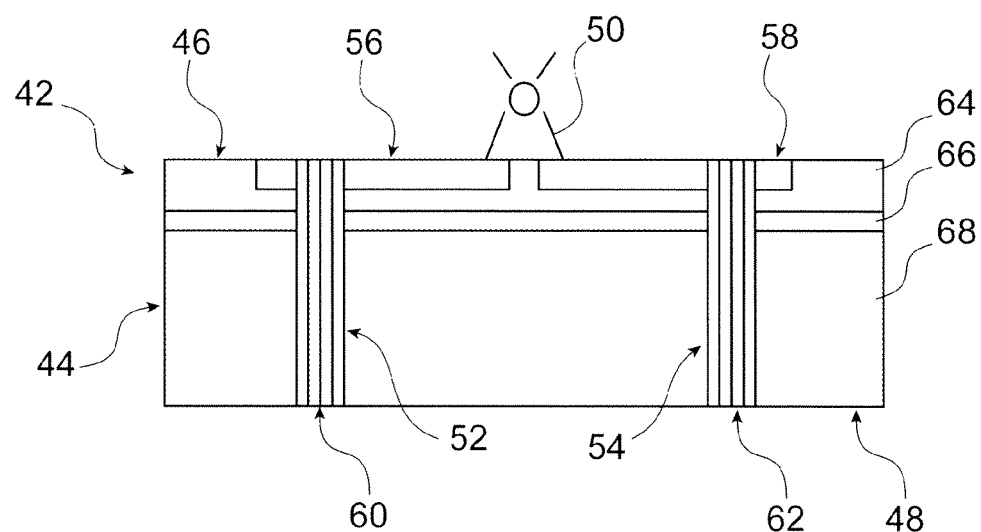
FIG. 3 is a diagrammatic cross-sectional view of an example of the receiving structure according to this invention.
Figure 4:
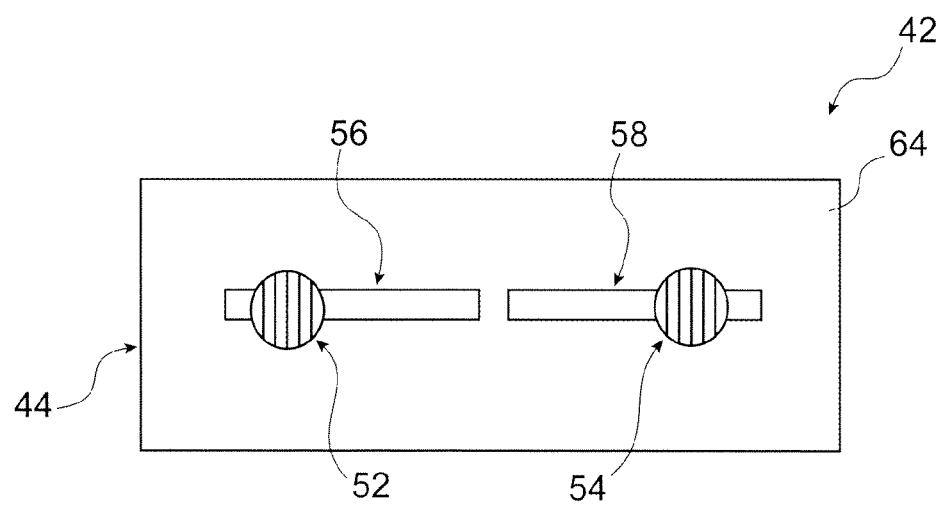
FIG. 4 is a diagrammatic top view of this example.

FIG. 3 is a diagrammatic sectional view of a particular embodiment of the receiving structure according to the invention. And FIG. 4 is a top view of this particular embodiment. This receiving structure or interposer has reference 42 in FIGS. 3 and 4. It has horizontal electrical connections connected to vertical electrical connections.

More precisely, the receiving structure 42 shown in FIGS. 3 and 4 comprises a support 44, the top face of which is marked as reference 46 and the bottom face opposite the top face is marked as reference 48. This receiving structure 42 is designed for electrically connecting a nano-object 50 onto the top face 46 and to continue the electrical contact on the bottom face 48. The receiving structure 42 is also provided with two interconnects 52 and 54 that pass through the support 44 from the top face 46 to the bottom face 48.

These faces 46 and 48 comprise contact continuity zones for each of the interconnects 52 and 54 respectively: contact continuity zones associated with interconnects 52 and 54 on the top face 46 (respectively the bottom face 48), are marked as references 56 and 58 (respectively 60 and 62).

According to the invention, the contact continuity zones 56 and 58 are doped zones of the support 44. And each doped zone 56 or 58 has a pattern adapted to the fan out of the interconnect 52 or 54 associated with it, on the top face 46 of the support 44.

In the example shown, the support 44 is a semiconductor on insulator type multi-layer. It comprises a resistive silicon layer 64 formed on a silica layer 66, itself formed on a silicon substrate 68.

The doped zones 56 and 58 are formed in the resistive silicon layer 64 on part of its thickness.

The zones 56 and 58 are doped by implantation of doping agents for example such as arsenic, phosphorus or boron in the layer 64, and then activation of these doping agents. These zones 56 and 58 are connected to vertical vias forming the interconnects 52 and 54 and are made of polysilicon doped for example by phosphorus or boron.

Thus, interconnects 52 and 54 in the invention are advantageously vertical or more precisely perpendicular to the lower face 48 and the upper face 46 of the support 44.

In one variant, the vertical vias may be made of tungsten that may for example be deposited by CVD (Chemical Vapour Deposition).

As mentioned above, the doped zones 56 and 58 are made in the top part of the support or substrate 44; and this substrate is an SOI substrate composed of the layer 68 (silicon a few hundred micrometers thick), the layer 66 (BOX a few hundred nanometers to a few micrometers thick) and the layer 64 (silicon of the order of a few hundred nanometers to a few tens of micrometers thick).

The two silicon layers 64 and 68 used in this case are made of high resistivity silicon, typically with a resistivity of the order of $10^3$ ohm.cm to $5 \times 10^3$ ohm.cm, so as to maintain electrical insulation between the different doped zones.

A material other than silicon can be envisaged for the layer 68, for example glass or ceramic that will be electrically insulating but shall be anisotropically etched so that the TSVs formed by the vertical vias can be made.

Figure 5:
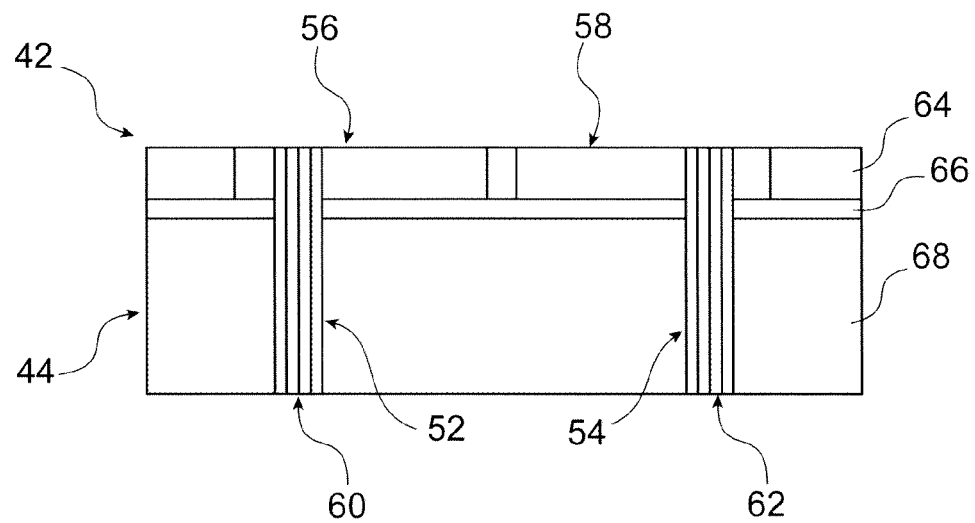
FIG. 5 is a diagrammatic cross-sectional view of a variant of this example.

FIG. 5 is a diagrammatic sectional view of a variant of the receiving structure 42 in FIG. 3: in the example shown in FIG. 5, the doped zones are formed in the silicon layer 64, throughout the entire thickness thereof, and therefore stop on the oxide layer 66 (BOX).

Figure 6:
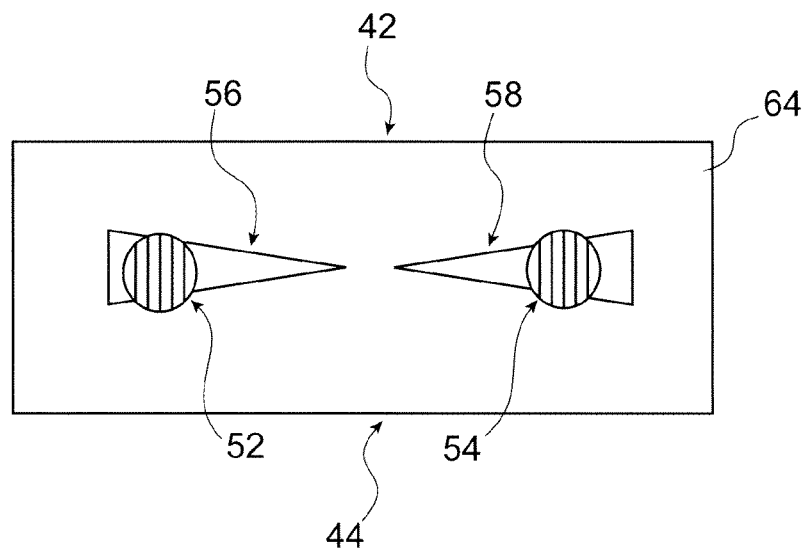
FIGS. 6 and 7 are diagrammatic top views of other variants of this example.

Various geometries are possible for the definition of doped zones 56 and 58. This is shown in FIG. 6 that is a diagrammatic top view of a variant of the receiving structure 42 in FIG. 4. As can be seen in FIG. 6, the doped zones 56 and 58 may be in the shape of a tip (hence two tips facing each other), while the doped zones are straight in FIG. 4.

In some cases, the studied nano-object may require more than two electrical connections. This is shown in FIG. 7 that is a diagrammatic top view of a variant of the receiving structure in FIG. 4.

Figure 7:
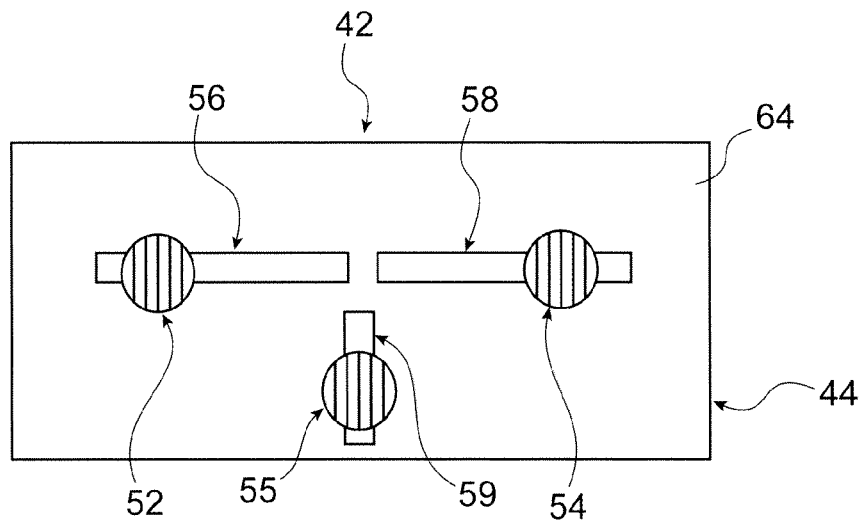

As can be seen in FIG. 7, the nano-object may for example require three connections. And the receiving structure then comprises three doped zones, namely zones 56 and 58 and an additional doped zone 59 made of monocrystalline silicon like zones 56 and 58. An additional interconnect 55 associated with zone 59 is then necessary in addition to the interconnects 52 and 54 associated with zones 56 and 58 respectively.

Figure 8:
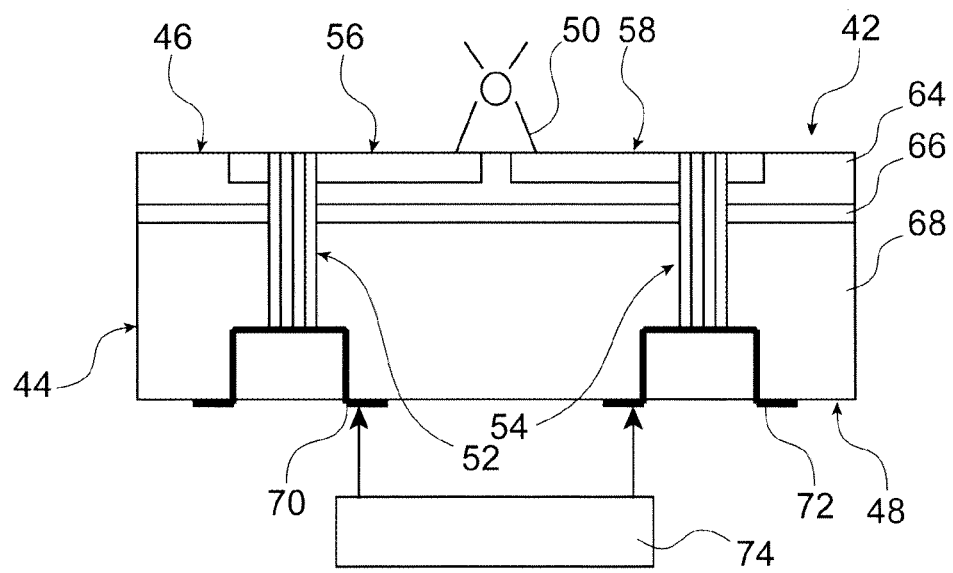
FIG. 8 is a diagrammatic cross-sectional view of the example shown in FIG. 3, together with electrical connections on its bottom face.
Figure 9:
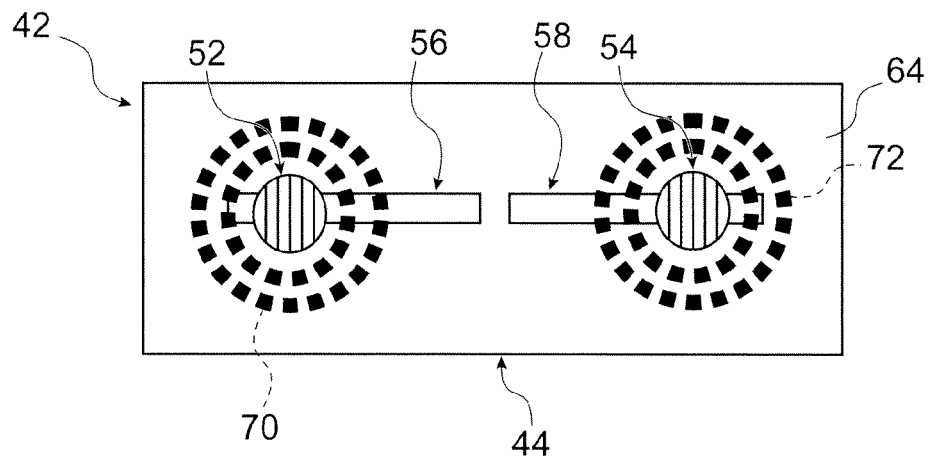
FIG. 9 is a diagrammatic top view of the example shown in FIG. 8.

FIG. 8 is a diagrammatic cross-sectional view of another example of the invention. And FIG. 9 is a top view of this other example.

As can be seen, this other example is different from the example shown in FIGS. 3 and 4: electrical connections 70 and 72 have been added in FIGS. 3 and 4 opening up on the back face 48 of the receiving structure 42 and in contact with interconnects 52 and 54 respectively.

In fact, in accordance with a manufacturing method that will be described later, the interconnects in FIGS. 8 and 9 do not initially open up on the back face 48; and the layer 68 is etched through this back face 48 to reach the interconnects. The electrical connections 70 and 72 are then formed so that they are in contact with the interconnects.

For example, the electrical connections 70 and 72 make it possible to connect the nano-object 50 to an appropriate external electrical system 74, through interconnects 52 and 54 in order to make electrical measurements on the nano-object 50.

Figure 10:
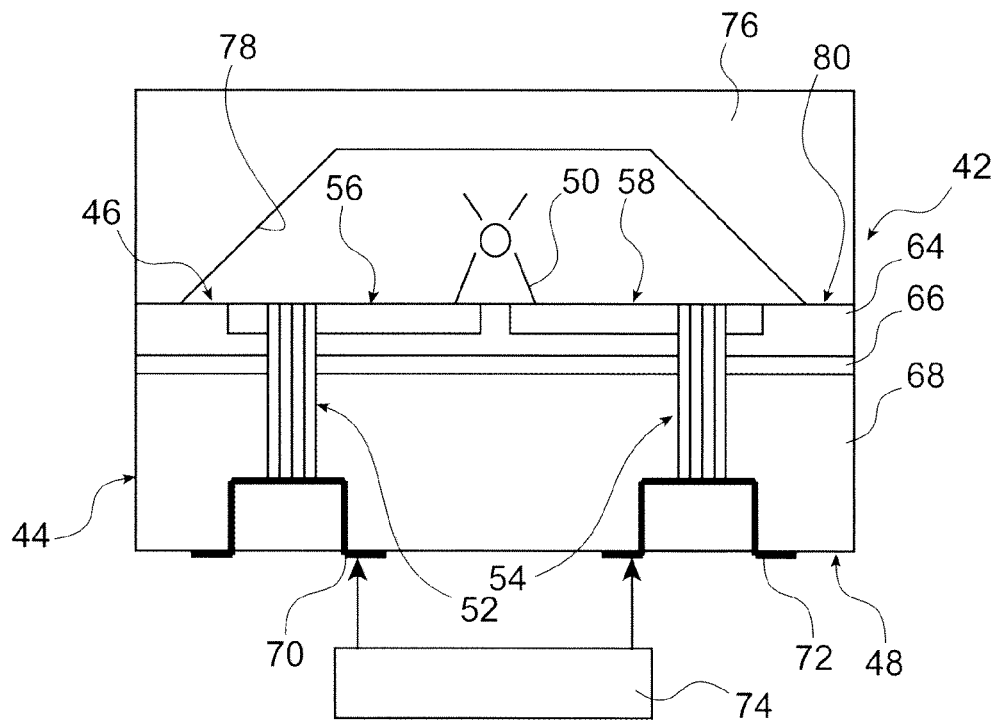
FIG. 10 is a diagrammatic cross-sectional view of the example shown in FIG. 8 together with a cover on its top face.

FIG. 10 diagrammatically shows the fact that an receiving structure according to the invention can comprise a cover 76 with a cavity 78 adapted to enclose the nano-object 50 that is electrically connected to the doped zones 56 and 58.

In the example shown, the cover 76 is transferred onto the interposer 42 that has been disclosed with reference to FIG. 8. As can be seen, the cover 76 is glued to the SOI substrate 44 of the structure 42 through a gluing zone 80 that extends on the top face 46 of the substrate 44 and surrounds all doped zones 56 and 58.

Figure 11:
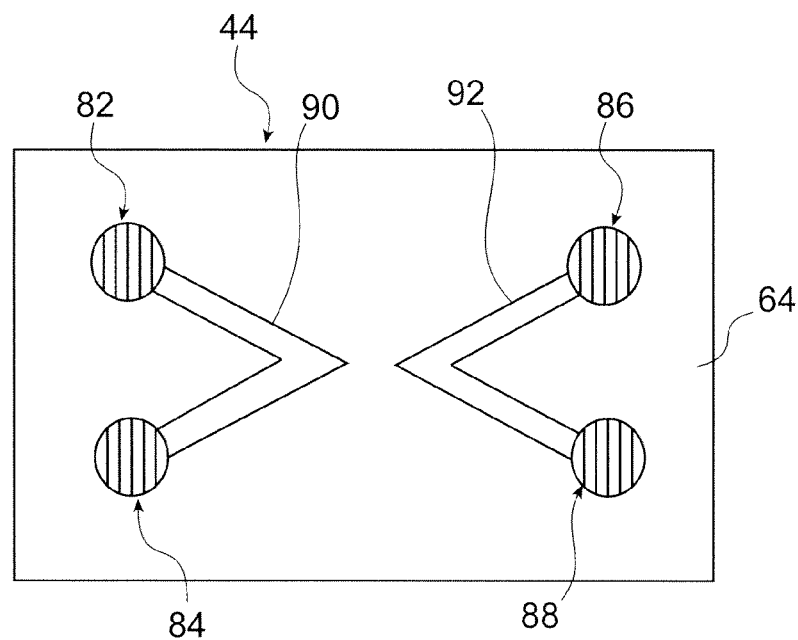
FIGS. 11 to 13 are diagrammatic top views of other examples of the interposer according to the invention.
Figure 12:
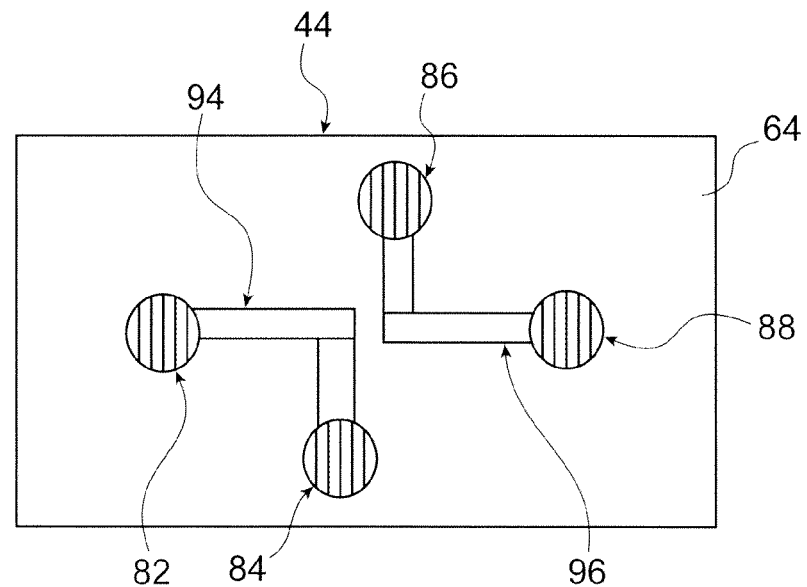
Figure 13:
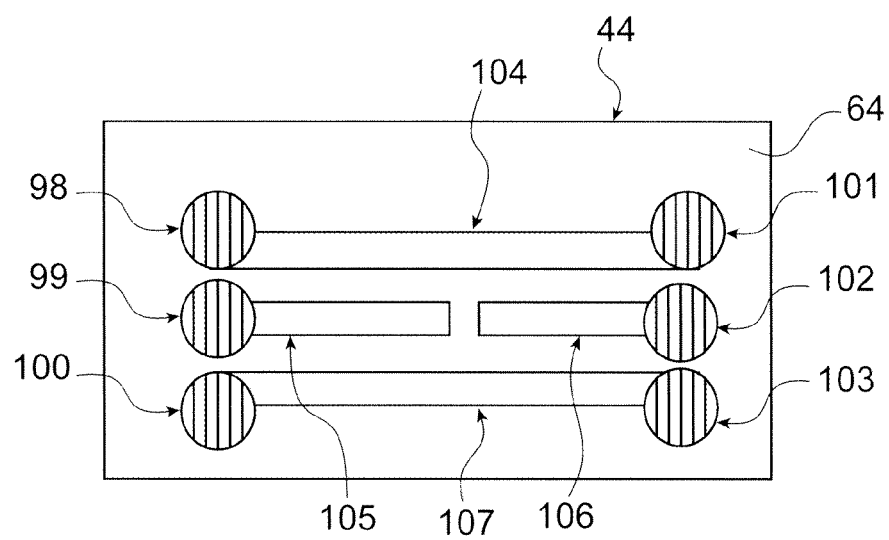

FIGS. 11 to 13 are diagrammatic top views of interposers conforming with the invention and form structures to test the nano-objects.

The examples in FIGS. 11 and 12 are test structures with four pads. In this case as can be seen, the substrate 44 is provided with four interconnects 82, 84, 86 and 88 (instead of two or three in the previous examples). And two doped zones 90 and 92 (FIGS. 11) or 94 and 96 (FIG. 12) are provided in the silicon layer 64.

As can be seen in the case in FIG. 11, the zones 90 and 92 form Vs with tips facing each other. The ends of the zone 90 are connected to the interconnects 82 and 84 respectively, while the ends of the zone 92 are connected to interconnects 86 and 88 respectively.

In the case in FIG. 12, as can be seen, the ends of the zone 94 are connected to interconnects 82 and 84 respectively, while the ends of the zone 96 are connected to interconnects 86 and 88 respectively. And as can be seen, each of the zones 94 and 96 is in two straight parts orthogonal to each other. And two respective parts of the zones 94 and 96 are in line (and are separated from each other).

The example in FIG. 13 is a test structure with three ports with a coplanar ground. In this case as can be seen, the substrate 44 is provided with two groups of three interconnects facing each other 98, 99, 100 and 101, 102, 103.

Four straight and parallel doped zones 104, 105, 106, 107 are provided: as can be seen, the zone 104 connects interconnects 98 and 101; zone 107 connects interconnects 100 and 103; and zones 105 and 106 are connected to interconnects 99 and 102 respectively that are in line with each other but separated from each other and are between zones 104 and 107.

Various advantages resulting from the invention are disclosed below.

1—The receiving structure 42 may be made from silicon only, or silicon oxide and conventional silicon doping agents (type N or P). In one variant, a substrate 42 composed of a first layer of high resistivity monocrystalline silicon can be used (corresponding to layer 64) under which a layer of monocrystalline insulator is deposited, for example a monocrystalline sapphire layer. This sapphire layer then replaces layers 66 and 68.

2—The receiving structure 42 may be heated to a temperature compatible with an atomic reconstruction of the external surface of the layer 64, typically a temperature of the order of 1100° C.

3—The connection tracks formed by doping (doped zones) do not disturb reconstruction of the surface necessary for deposition of nano-objects such as molecules.

4—The pattern of the doped zones and the control of the diffusion of the doping agents is designed to bring the doped zones to a distance from each other equal to a few nanometers to a few tens of nanometers. For example, for a diffusion coefficient of $10^{-11} cm^2/s$, a 10-minute heat treatment of 1100° C. causes diffusion over a distance of 1550 nm. For diffusion coefficients varying from $10^{-12} cm^2/s$ to $10^{-13} cm^2/s$, the results obtained are 490 nm and 155 nm respectively. Therefore, the ends of the implanted zones have to be separated by at least twice the diffusion distance if the required end result is electrically conducting zones that are a few nanometers away from other. These dimensions are compatible with the photolithography tools used to define zones to be implanted. In one variant, it could be envisaged to dope the zones 56 and 58 by doping agents with different chemical natures (same P or N type doping for the two zones, or P doping for one zone and N doping for the other zone).

5—The pattern of each zone to be implanted may be defined with various geometries and so as to better control the doping agent diffusion profile.

6—The descending vias, also called vertical vias in the previously disclosed examples, are preferably several micrometers to several hundred micrometers distant from the zone located between the ends of the doped zones, in other words the zone for which the surface will be reconstructed at the atomic scale. Therefore they do not disturb reconstruction of this zone.

7—Reconstruction of the top surface 46 makes it possible to add on a silicon cover 76 by silicon to silicon molecular bonding.

8—Vias opening up onto the back face 48 of the receiving structure 42 may be obtained by a conventional TSV (Through Silicon Via) manufacturing method.

The following describes steps in a method for manufacturing a receiving structure according to the invention.

1—In the case of an SOI substrate 44, down vias are constructed using a photolithography and DRIE (Deep Reactive Ion Etching) process. The vias are advantageously defined using a tube geometry for which the thickness is about a few micrometers. Several coaxial tubes can be formed, for example three, instead of a single tube, in order to reduce the electrical resistance of each down via; for example, a 10 μm diameter tube could be formed first and this tube is surrounded by two other tubes with diameters equal to 30 μm and 50 μm respectively.

2—The vertical vias (down vias) are filled by chemical vapour deposition (CVD) of doped polycrystalline silicon. As a variant, they can be filled with tungsten deposited also by CVD or more generally with any refractory metal compatible with the heat treatment described in step 8 below.

3—Chemical mechanical polishing (CMP) is done to remove the silicon that was deposited on the surfaces of the substrate.

4—An implantation mask is deposited, for example silicon oxide or silicon nitride with a thickness of the order of 1 μm or less, depending on the required resolution and the dose to be implanted.

5—The next step is photolithography and etching of the mask.

6—The doping agents are implanted.

7—The mask is removed.

8—Heat treatment is carried out at a temperature of the order of 1100° C. for a few minutes, so as to simultaneously reconstruct the surface and diffuse the doping agents. This temperature is given as an example; it would be possible to envisage lower temperatures between about 900° C. and 1100° C.

9—The cover is then treated (reference 76 in FIG. 10) using the same method as described in step 8 and the cover is assembled to the substrate in order to protect the reconstructed surface. Advantageously, the assembly operation is done under a controlled atmosphere, for example a nitrogen atmosphere or an inert gas such as argon.

10—The back face of the assembly thus obtained is thinned.

11—Photolithography and etching of the silicon are done from this back face until opening up onto the previously formed down vias.

12—Metallic layers (layers 70 and 72 in FIG. 10) are deposited to extend the electrical contact from the bottom of each via as far as the back face of the assembly obtained. In one variant of this embodiment, thinning (step 10) may be done until opening up onto the down vias. In this case, the step 11 is not necessary.

According to another example of the manufacturing method according to the invention, the order of steps 1 to 11 above is modified; steps 4, 5, 6, 7 are done first, then steps 1, 2, 3 and then steps 8, 9, 10 and 11.

The receiving structures described in the examples given above comprise a single nano-object. But obviously those skilled in the art could adapt the examples given to obtain receiving structures conforming with the invention and comprising several nano-objects.

Furthermore, in the examples given, the doped zones are formed on the top face of the substrate used (face 46 of the substrate 44 in the examples described). But doped zones could be formed on the bottom face of this substrate (face 48 in the examples disclosed) without going outside the scope of the invention, when required. Those skilled in the art can adapt the examples given above to this case.

Several application fields of the invention have already been mentioned above. It can be added that this invention can be used to make structures collectively comprising one or several nano-objects hermetically encapsulated under a controlled atmosphere. In particular, it is thus applicable to the fabrication of "Beyond CMOS" type microelectronic systems.

What is claimed is:

1. A receiving structure comprising:
a support with a first face or top face, and a second face or bottom face opposite the first face, for electrically connecting at least one nano-object onto the first face and to re-establish electrical contact on the second face,
at least first and second interconnects passing through the support from the first face to the second face and being exposed at the first face and the second face,
a first contact continuity zone provided to the first face, said first contact continuity zone being electrically connected to the first interconnect, and
a second contact continuity zone provided to the first face, said second contact continuity zone being electrically connected to the second interconnect,
the first and second contact continuity zones are doped zones of the first face of the support extending at least partially about a perimeter of exposed regions of the first and second interconnects at the first face, each doped zone having a pattern that extends away from the exposed regions of the first and second interconnects on the first face of the support.

2. The receiving structure according to claim 1, wherein the interconnects are perpendicular to the first and second faces.

3. The receiving structure according to claim 1, wherein the support is a multi-layer and comprises at least one resistive layer at the first face of the support, and wherein the doped zones are formed in the resistive layer on at least part of its thickness.

4. The receiving structure according to claim 3, wherein the support is a semiconductor on insulator type support and comprises a semiconducting surface layer, wherein the resistive layer consists of the semiconducting surface layer.

5. A receiving structure according to claim 1, also comprising a cover with a cavity of suitable size to enclose the nano-object.

6. A method for manufacturing a receiving structure comprising a support with a first face or top face, and a second face or bottom face opposite the first face, for electrically connecting at least one nano-object onto the first face and to re-establish electrical contact on the second face, the method comprising:
forming vias from the first face of the support and depositing an electrically conducting material in the vias in order to form first and second interconnects passing through the support from the first face to the second face and being exposed at the first face and the second face,
forming a first contact continuity zone provided to the first face, said first contact continuity zone being electrically connected to the first interconnect, wherein said forming the first contact continuity zone comprises implanting doping agents in the first face in a region that extends at least partially about a perimeter of the first interconnect exposed at the first face, forming a second contact continuity zone provided to the first face, said second contact continuity zone being electrically connected to the second interconnect, wherein said forming the second contact continuity zone comprises implanting doping agents in the first face in a region that extends at least partially about a perimeter of the second interconnect exposed at the first face, and wherein the first and second contact continuity zones extend away from the perimeter of the first and second interconnects exposed at the first face, and a heat treating the doping agents implanted in the first face to diffuse the implanted doping agents.

7. The method according to claim 6, wherein the support is thinned so that the vias open up on the second face of the support.

8. The method according to claim 6, wherein electrically conducting layers are also formed on the second face of the support and are respectively associated with the vias, each of the electrically conducting layers being in contact with the electrically conducting material of the respective via.

9. The method according to claim 6, wherein each via has a tubular geometry with a single tube or several coaxial tubes.

10. The method according to claim 6, wherein a cover, comprising a cavity, is transferred onto the first face of the support under a controlled atmosphere.

* * * * *